United States Patent
Jiang et al.

(10) Patent No.: US 7,417,305 B2
(45) Date of Patent: Aug. 26, 2008

(54) ELECTRONIC DEVICES AT THE WAFER LEVEL HAVING FRONT SIDE AND EDGE PROTECTION MATERIAL AND SYSTEMS INCLUDING THE DEVICES

(75) Inventors: Tongbi Jiang, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 10/928,666

(22) Filed: Aug. 26, 2004

(65) Prior Publication Data

US 2006/0043364 A1    Mar. 2, 2006

(51) Int. Cl.
*H01L 23/58* (2006.01)
(52) U.S. Cl. .............................. 257/632; 257/787
(58) Field of Classification Search ................ 257/632, 257/787, E23.116; 438/781
See application file for complete search history.

(56) References Cited

U.S. PATENT DOCUMENTS

| | | | | |
|---|---|---|---|---|
| 5,879,572 | A * | 3/1999 | Folsom et al. ................. 216/49 |
| 5,977,641 | A * | 11/1999 | Takahashi et al. ........... 257/778 |
| 6,180,504 | B1 | 1/2001 | Farnworth et al. |
| 6,187,615 | B1 | 2/2001 | Kim et al. |
| 6,544,902 | B1 * | 4/2003 | Farnworth ................... 438/781 |
| 6,578,755 | B1 | 6/2003 | Elenius et al. |
| 6,893,904 | B2 * | 5/2005 | Akram ........................ 438/127 |
| 7,043,830 | B2 | 5/2006 | Farnworth |
| 7,253,078 | B1 * | 8/2007 | Nguyen et al. ............... 438/411 |
| 2003/0057572 | A1 * | 3/2003 | Berry .......................... 257/787 |
| 2003/0096453 | A1 * | 5/2003 | Wang et al. .................. 438/108 |
| 2005/0126686 | A1 * | 6/2005 | Cheong et al. ............... 156/153 |

OTHER PUBLICATIONS

Barrett et al., "Polymer Collar WLP—A New Wafer Level Package For Improved Solder Joint Reliability," date unknown, 9 pages, Kulicke & Soffa, Phoenix, AZ.

* cited by examiner

*Primary Examiner*—Tuan H Nguyen
(74) *Attorney, Agent, or Firm*—TraskBritt

(57) ABSTRACT

Methods for applying a dielectric protective layer to a wafer in wafer-level chip scale package manufacture are disclosed. A flowable dielectric protective material with fluxing capability is applied over the active surface of an unbumped semiconductor wafer to cover active device areas, bond pads, test socket contact locations, and optional pre-scribed wafer street trenches. Preformed solder balls are then disposed over the bond pads, and the wafer is subjected to a heating process to reflow the solder balls and at least partially cure the dielectric protective material. During the heating process, the dielectric protective material provides a fluxing capability to enable the solder balls to wet the bond pads. In other exemplary embodiments, the dielectric protective material is applied over only intended physical contact locations and/or pre-scribed wafer street trenches, in which case the dielectric protective material need not include flux material and may additionally include a filler material.

17 Claims, 7 Drawing Sheets

ELECTRONIC DEVICES AT THE WAFER LEVEL HAVING FRONT SIDE AND EDGE PROTECTION MATERIAL AND SYSTEMS INCLUDING THE DEVICES

BACKGROUND OF THE INVENTION

The present invention relates to packaging of electronic devices. More particularly, the present invention relates to methods of forming a protective material layer at the wafer level to protect at least portions of active surfaces and edges of chip scale packages including electronic devices.

Factors of cost and density are increasingly important in the electronics industry. Conventionally, high-density electronic devices in the form of semiconductor dice are packaged in transfer molded housings for protection from the environment and to provide electrical connections with the higher-level circuit structures into which they are incorporated. In an effort to reduce size and expense, semiconductor manufacturers have developed chip scale package ("CSP") structures, which add minimal physical dimension to the completed devices and eliminate capital expense and processing steps associated with conventional packaging methods.

The formation of CSP structures may involve forming a dielectric layer adhered directly on one or more surfaces of a semiconductor die to seal and protect it from mechanical and environmental damage. In conventional CSP-forming processes, a passivation layer is typically formed on the active surface of a semiconductor die with apertures to expose the die bond pads, and an under-bump metallization (UBM) layer may be formed over the exposed bond pads to facilitate wetting of material of a conductive bump, such as a tin/lead solder, to be formed thereon to provide input/output, or "I/O," connections for the CSP. The UBM layer may also, alternatively be located across the passivation layer remote from original bond pad locations at ends of conductive traces in the form of a so-called "redistribution layer" to relocate the external contact (bond pad) locations for connecting the semiconductor die to higher-level circuit structures. In such an instance, another dielectric layer is typically formed over the redistribution layer, apertures through the dielectric layer exposing I/O pad locations at the end of the conductive traces where the UBM layer may be formed. Discrete conductive elements in the form of bumps or balls may then be formed on or attached to the UBM layer-covered external contact locations to enable connection with higher-level circuit structures by flip-chip attachment. A mask layer may optionally be applied to surround the external contact locations prior to forming conductive bumps, which prevents the bump material from wicking onto adjacent die surfaces. Alternatively, a tape automated bonding (TAB) attachment approach may be employed. Finally, a layer of polymer or other dielectric protective material is conventionally coated onto one or more additional surfaces of the die to complete the CSP. The completed CSP is typically no more than 1.2 times larger than the die itself.

A further advantage of CSP structures is that they may be fashioned wholly or in part prior to the singulation of a wafer containing a plurality of semiconductor die locations. This approach, often being referred to as "wafer-level packaging," provides simultaneous formation of a large number of electronic device packages. After the desired circuitry, bond pads, passivation layer, optional UBM and mask layers for the electronic devices have been fabricated on the active side of the wafer, conductive bumps are provided using conventional formation methods. One widely used method is evaporative deposition of metal onto a mask. The mask is formed on the wafer with apertures corresponding to the bond pad or other external contact locations and metal is deposited in the apertures. Once enough metal is deposited, the mask is removed and the metal is reflowed by heating to a molten state to form a discrete conductive element in a final bump or ball shape.

Another alternative for bumping a wafer is to employ stencil printing. Rather than evaporating metal through a mask, a solder paste is screened over a stencil and fills apertures therein corresponding to the bond pad or other external contact locations. The stencil is removed from the surface of the wafer, and the solder is reflowed for bonding to the UBM. Once the conductive bumps are in place, the entire active side of the wafer may or may not be coated with the aforementioned CSP protective layer. This is accomplished by molding, spin-coating or otherwise applying the protective layer to the surface of the wafer by methods known in the art. The wafer is subsequently singulated to excise the individual semiconductor dice, and further protective layers may be added to coat any remaining exposed die surfaces.

A further alternative for wafer bumping is to place preformed metal balls, such as solder balls, on the wafer at selected locations. The wafer is then heated to at least partially melt the solder balls and metallurgically bond them to the UBMs or other contact structures on the wafer. As before, once the conductive bumps are in place, the entire active side of the wafer is coated with the aforementioned CSP protective layer. This is accomplished by molding, spin-coating or otherwise applying the protective layer to the surface of the wafer by methods known in the art. The wafer is subsequently singulated to excise the individual semiconductor dice, and further protective layers may be added to coat any remaining exposed die surfaces.

One disadvantage in conventional wafer-level packaging has been encountered due to the formation of the conductive bumps before applying the layer of dielectric protective material to the active side of the wafer. The layer often completely covers the conductive bumps or, if not, at least contaminates portions of the surfaces of the conductive bumps. Therefore, the dielectric protective material must be etched back, ground down or otherwise partially removed to expose the conductive bumps for electrical contact. Furthermore, surface tension between the dielectric protective material and the conductive bumps can cause irregularities during coating and thereby reduce the uniformity of the protective layer.

Another disadvantage in conventional wafer-level packaging has been encountered in connection with testing CSPs. A singulated die is typically placed in a test socket for testing. Contact between the CSP and the test socket, particularly at edges and corners of the active surface of the CSP, can cause damage to the integrated circuit of the device. Such damage is particularly likely to occur when residual particles remain in the test socket from prior use, providing point loading of the protective layer and the underlying active surface. Damage can also, and frequently does, occur in the ordinary course of handling CSPs.

Yet another disadvantage in known wafer-level packaging is warpage resulting from the formation of protective layers over an entire surface of a CSP, which results in lower yields of CSPs.

In view of the foregoing, there is a clear need for improved methods for wafer-level packaging that address the existing problems associated with forming protective layers in CSPs.

BRIEF SUMMARY OF THE INVENTION

The present invention comprises methods for applying dielectric protective material during fabrication of an electronic device package such as a CSP that overcome the above-described and other disadvantages in the prior art. In contrast to the above-described state of the art, the present invention enables conductive bumps to be formed on an electronic device in the form of a semiconductor wafer after the semiconductor wafer has been provided with a protective layer of dielectric material on the active side thereof, as well as optionally on one or more additional surfaces. Further, the present invention enables the formation of a dielectric protective layer on the front side (active surface) and edges of semiconductor dice prior to their singulation from a wafer or other bulk semiconductor substrate.

In some exemplary embodiments, the present invention provides a wafer-level packaging method wherein a dielectric protective layer is applied over at least selected areas of the active side of an unbumped semiconductor wafer or other bulk semiconductor substrate containing a plurality of discrete electronic device locations, including over external contact locations associated with the electronic devices and, optionally, into trenches formed by pre-scribed wafer saw street areas thereon. The method allows simultaneous application of dielectric protective material to the active surface and active surface edges of CSPs to be formed from electronic devices singulated from the bulk semiconductor substrate. Broadly, the dielectric protective material may be applied to portions of the active side of the substrate and, optionally, into the trenches so as to afford physical protection to the discrete electronic devices where contact with an external structure during at least one of handling, processing and testing thereof is contemplated or intended. If the wafer is to receive preformed solder balls for use as discrete conductive elements as I/O contacts for the CSPs, the dielectric protective material may be formulated with a flux component to facilitate bonding of the solder during reflow to UBM structures at the external contact locations.

Subsequently, preformed solder balls may be disposed on the dielectric protective material above the external contact locations by methods known in the art. For example, a matrix of preformed solder balls may be positioned with a conventional jig. A passivation layer present on the active side of the wafer may be formed to an increased thickness to provide alignment recesses for the preformed solder balls with respect to the bond pads or other external contact locations to which the former are to be joined.

In other exemplary embodiments, the invention provides a wafer-level packaging method wherein a CSP protective layer is formed only over locations on each semiconductor die that may be contacted during handling of the CSP, by portions of a test socket structure used to test the CSP, or within pre-scribed wafer saw street trenches between die locations, or any of the foregoing locations, rather than over the entire active side of a wafer. In such embodiments, a protective material lacking fluxing capability may be used.

After the dielectric protective material is applied to the wafer, the wafer is subjected to a heating process to at least partially cure the dielectric protective material to at least a semisolid state. In embodiments in which the dielectric protective material is applied over the external contact locations in conjunction with solder balls, the heating process concomitantly cures the protective layer and reflows the solder balls to form a metallic joint between the solder balls and the corresponding external contact locations. As noted above, the dielectric protective material is formulated to provide a fluxing capability such that the reflowed solder balls wet to the external contact locations and form conductive joints therewith upon cooling.

The heating process may partially or fully cure the protective layer. If the protective layer is only partially cured, then a subsequent heating process may be performed to fully cure the protective layer. The wafer may be diced or singulated either before or after the subsequent heating process.

The present invention also advantageously eliminates the need for flux cleaning and reduces contamination of solder balls because all residual flux material present in the material of the protective layer and used to attach the solder balls during reflow remains contained within the cured protective layer after conductive bump formation.

The present invention advantageously enables application of dielectric protective layers to the edges of semiconductor dice before singulation. This is accomplished by pre-scribing street areas, thus forming trenches in which the dielectric protective material is disposed. The trenches are wider than the wafer saw blade that is to be used to singulate the semiconductor dice, and the dielectric protective material is at least partially cured before singulation. Thus, at least some protective material disposed in the trench before singulation remains on the edges of the semiconductor dice as defined by sidewalls of the trench after singulation. The dielectric protective material disposed in the pre-scribed street area trenches provides protection on the edges of the corresponding semiconductor dice after singulation and, as appropriate, subsequent heating to complete the cure of the dielectric protective material.

Because the conductive bumps are placed after the active side of the wafer has been covered by the protective layer, additional processing to expose the bumps is not required and the conductive bumps will not create irregularities in the protective layer.

In another embodiment, the protective layer may be disposed only on areas of potential physical contact with the CSP and apertures or gaps are left over the bond pad or other external I/O contact locations. A solder paste may then be stenciled or screen-printed onto the bond pads, and heat-induced reflow conducted to form solder balls. When employing this approach, a dual-thickness stencil may be used to contact the active surface of the semiconductor in proximity to and surrounding the bond pads (such term including under bump metallization on the bond pads) while remaining out of contact with the protective layer. Thus, while the upper surface of the stencil remains planar, the lower surface may be stepped, with a thicker portion dimensioned for contact with the active surface and including apertures providing receptacles for the solder paste and a thinner portion dimensioned so as to remain out of contact with portions of the protective layer thereunder.

Other and further features and advantages will be apparent to those of ordinary skill in the art from the following detailed description of the present invention when read in conjunction with the accompanying drawings. It should be understood that the embodiments described herein are provided for illustrative and exemplary purposes only and that variations to, and combinations of, the several elements and features thereof are contemplated as being within the scope of the invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
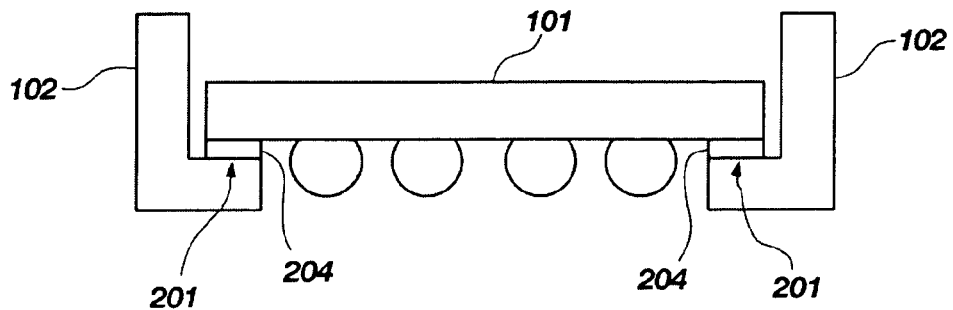
FIG. 1 is a cross-sectional view of a CSP disposed in a test socket.

Referring in general to the accompanying drawings, various aspects of the present invention are exemplified to show the CSP protective layer structures and protective layer formation methods of the present invention. Common elements of the illustrated embodiments are designated with like reference numerals. It should be understood that the figures presented in the drawings are not illustrative of actual views of any particular portion of actual device structures but, rather, are merely idealized schematic representations provided to more clearly and fully depict the invention.

Figure 2:
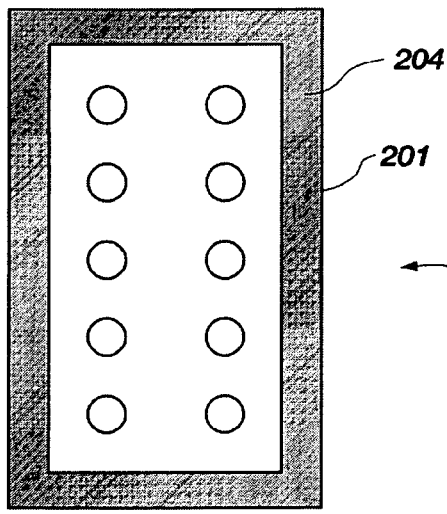
FIG. 2 is a schematic top view of a singulated semiconductor die with a protective layer of the invention disposed over test socket contact locations.
Figure 3:
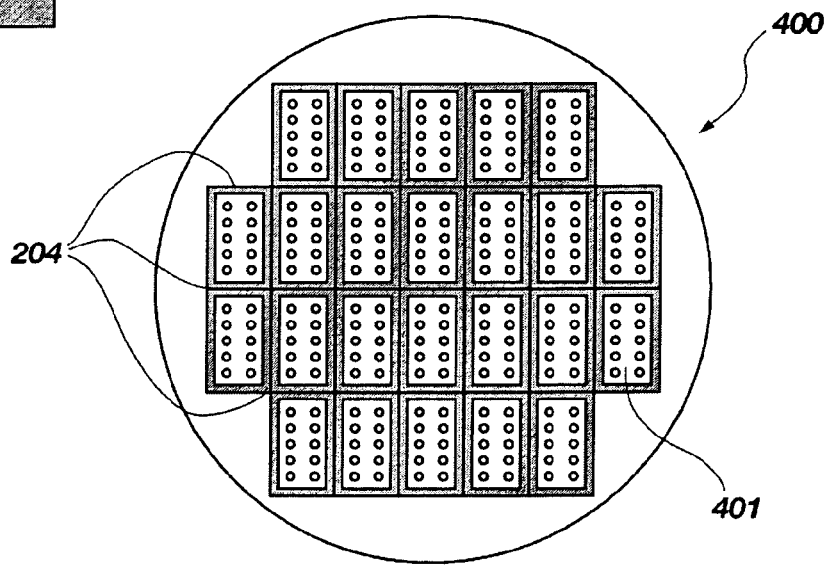
FIG. 3 is a schematic top view of a semiconductor wafer with a protective layer of the invention disposed over test socket contact locations of semiconductor die locations on the wafer.

FIGS. 1 and 2 show an example of a dielectric protective layer 204 of the invention formed on a periphery of the active side of a semiconductor die 101 over only peripheral test socket and other potential physical contact locations 201 at the die periphery that may contact the structure of test socket 102 or be otherwise contacted during handling. FIG. 3 shows an exemplary semiconductor wafer 400 with a protective layer 204 formed in a pattern of the invention over only potential test socket or other physical contact locations along a periphery of each semiconductor die location 401 on the semiconductor wafer 400.

Figure 4:
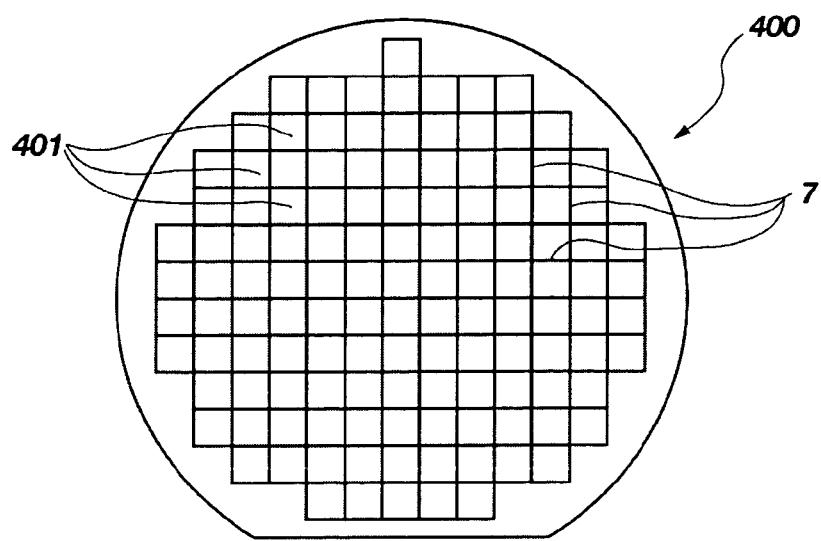
FIG. 4 is a schematic top view of a semiconductor wafer with semiconductor die locations and street areas depicted thereon.

Wafer-level packaging of semiconductor devices typically begins with a bulk semiconductor wafer 400, as depicted in FIG. 4. FIG. 4 shows a plurality of semiconductor die locations 401 and street areas 7 between the semiconductor die locations 401. As used herein, the terms "pre-scribe" and "scribe" are intended to refer to incompletely cutting the substrate (i.e., not all the way through the thickness thereof) along street areas 7.

Figure 5A:
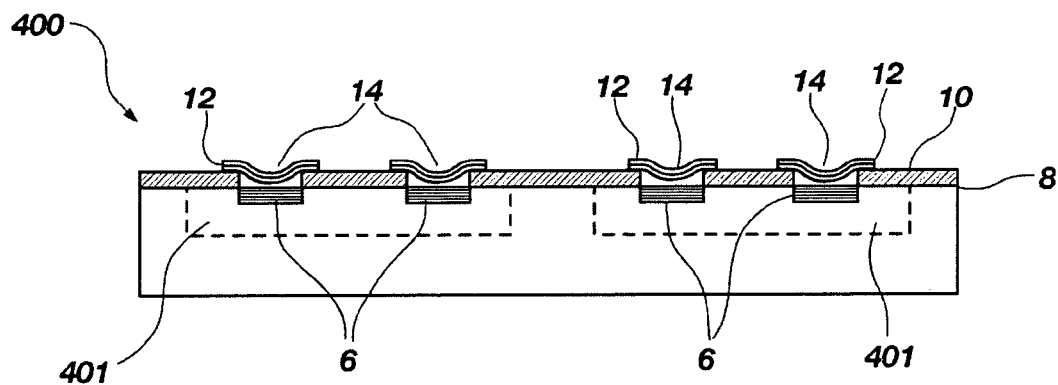
FIGS. 5A-5C show sectional side views of exemplary, differently configured semiconductor wafers at a stage of fabrication prior to forming CSP protective layer(s) thereover and applying conductive bumps.

In FIG. 5A, semiconductor wafer 400 is shown in cross-section at a stage of fabrication prior to application of the protective layer of the present invention. As used herein, the term "wafer" includes not only conventional silicon wafers but also other bulk semiconductor substrates such as wafers of gallium arsenide, indium phosphide, as well as silicon on sapphire (SOS) substrates, silicon on glass (SOG) substrates and other silicon on insulator (SOI) substrates. Semiconductor wafer 400 contains a plurality of semiconductor die locations 401, each location including integrated circuitry formed by conventional semiconductor processing techniques.

Bond pads 6 located on wafer active side 8 provide electrical connection points for the integrated circuitry of semiconductor die locations 401. Semiconductor wafer 400 is further provided with a passivation layer 10 to cover active side 8 while exposing bond pads 6, and UBM 12 is formed over the exposed bond pads. The UBM 12 is typically formed of one or more layers of metal that protect bond pads 6 and provide an improved metallurgical bond thereto, as well as providing external contact locations 14 offering improved wetting and metallurgical bonding capabilities to subsequently added discrete conductive elements in the form of, for example, tin/lead solder balls. The manner in which passivation layer 10 and UBMs 12 may be applied and configured on active side 8 is well known in the art and need not be further discussed in relation to the features of the present invention.

Figure 5B:
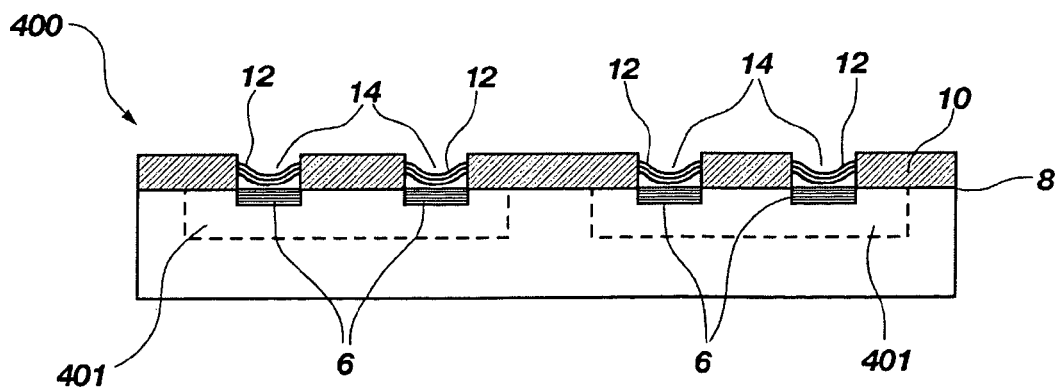

Problems sometimes can arise if, for example, solder balls become displaced from the locations of their corresponding external contact locations 14, 14'. Thus, in some embodiments, the external contact locations may be formed with a reduced thickness such that they are recessed below the surface of passivation layer 10, as depicted in FIG. 5B. Alternatively, the passivation layer 10 may be formed to a greater-than-conventional depth to provide recessed external contact locations 14 when passivation layer 10 or 10' is etched to expose the external contact locations 14. In this manner, solder balls placed over external contact locations 14 tend to stay in place due to the presence of the recesses, which need be only a few microns deep, and are thus less likely to be displaced.

Figure 5C:
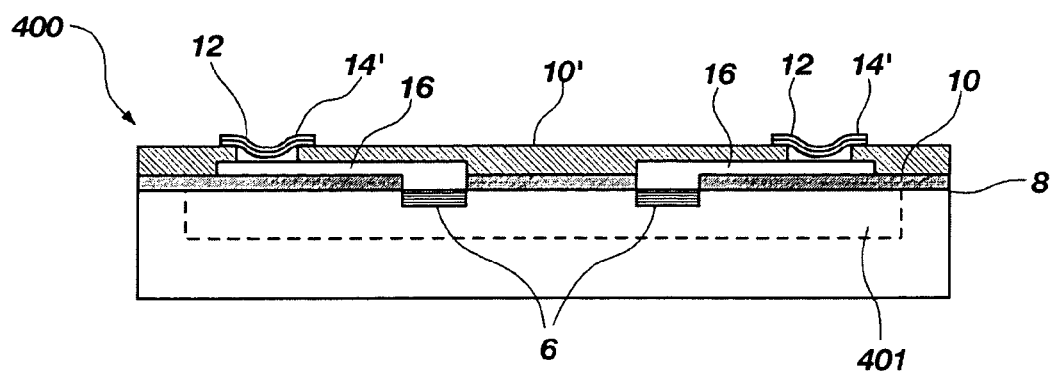

In FIG. 5C, another semiconductor wafer 400 is shown in cross-section at a stage of fabrication prior to application of the protective layer of the present invention. Bond pads 6 located on wafer active side 8 provide electrical connection points for the integrated circuitry of semiconductor die locations 401. Semiconductor wafer 400 is further provided with a passivation layer 10 to cover active side 8 while exposing bond pads 6. However, unlike the structure illustrated in FIG. 5A, UBM 12 is not formed directly over the exposed bond pads. Rather, a UBM 12 for each I/O contact location may be located remotely across passivation layer 10 from an original bond pad location at the ends of a conductive trace 16 of a redistribution layer (RDL) to provide alternate external contact locations 14' of larger area and spacing or pitch for receiving discrete conductive elements, such as solder balls, thereon. In such an instance, an additional passivation layer 10' is applied over the traces of the RDL and apertures are formed therethrough to expose locations for formation of each UBM 12 at a contact location 14'. Of course, the additional passivation layer 10' may be applied so that the contact locations 14' are recessed, as depicted in the embodiment illustrated in FIG. 5B with respect to bond pads 6 at original positions on semiconductor die locations 401.

Conventionally, the next step in fabrication for semiconductor wafer 400 would be to place discrete conductive elements in the shape of bumps or balls on external contact locations 14, 14'. As discussed hereinbefore, such methods suffer from a number of problems that may result in defects and reduced efficiency. In some exemplary embodiments of the present invention, prior to adding conductive elements, a dielectric protective layer 20 (FIGS. 6A-6C) is formed on active side 8 and, in some exemplary embodiments, within pre-scribed street area trenches 9 (see FIG. 6D) of semiconductor wafer 400. Dielectric protective layer 20 may become part of a CSP structure for a completed electronic device and, in some exemplary embodiments, may be formulated to provide fluxing capability to assist in the wetting and bonding of conductive elements such as solder balls to the external contact locations 14 or 14'. FIGS. 6A-6D illustrate how these functions may be accomplished.

Figure 6A:
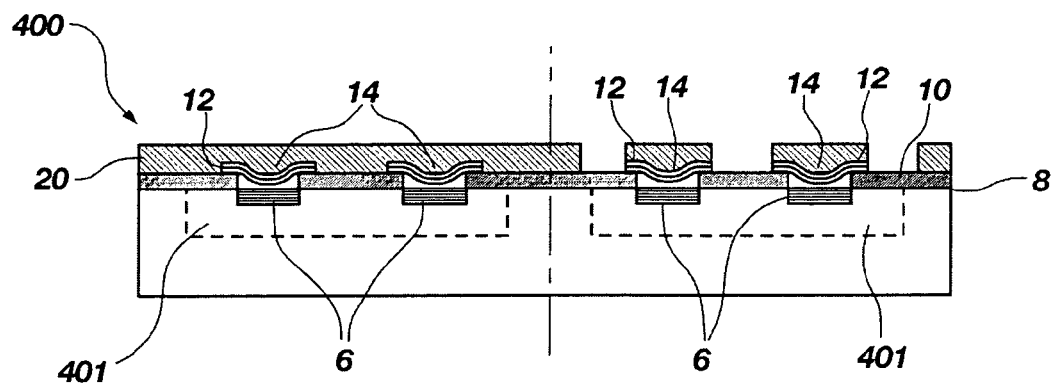
FIGS. 6A-6D show the formation of a CSP protective layer and conductive bumps of the present invention on the semiconductor wafer depicted in FIG. 5A.

As shown in FIG. 6A, semiconductor wafer 400 has been furnished with dielectric protective layer 20 by methods known in the art. It should be understood that the present invention is applicable to the use of wafers bearing RDL structures (see FIG. 5C) as well as those wherein original bond pad locations are bumped. However, for clarity the present invention is depicted wherein original bond pad locations are bumped. Dielectric protective layer 20 may be applied, for example, by photolithography, stencil printing, screen printing, spin coating, dispensing and other similar or equivalent methods currently known in the art or discovered in the future. As shown on the left-hand side of FIG. 6A, protective layer 20 may be disposed over the entire active side 8, or only on selected portions thereof, as shown on the right-hand side of FIG. 6A. Dielectric protective layer 20 may also be disposed into pre-scribed street area trenches 9 (FIG. 6D).

Dielectric protective layer 20 may be formed of, for example, a material containing a fluxing agent or otherwise having fluxing capability, such as, but not limited to, FF2000 available from Henkel Loctite Corporation of Industry, California; RP677-1 and RP677-2 available from Ablestik Laboratories of Rancho Dominguez, Calif.; and CRP4700G1 available from Sumitomo Plastics America Inc. of Santa Clara, Calif.

In exemplary embodiments of the present invention in which dielectric protective layer 20 is formed only at intended test socket or other physical contact locations 201 and/or in pre-scribed street area trenches 9 (i.e., not over external contact locations 14, 14'), the dielectric protective layer 20 may be formulated without flux material, such as, but not limited to, RP658-5B and RP658-7A available from Ablestik Laboratories of Rancho Dominguez, Calif. As one of ordinary skill in the art will readily appreciate, the protective properties of the protective layer 20 are improved as the hardness thereof is increased. For instance, the exemplary protective layer material RP658-5B has a modulus of approximately 6 GPa, which, as shown below in Table 1, Column B, provides good protection at a thickness of 15 μm.

If only selected areas of a wafer active side are to be covered with protective layer 20, it may be desirable to employ a relatively high viscosity, flowable material to enable precise placement of segments of the dielectric protective material. However, if the entire active side is to be covered, a low viscosity dielectric protective material may be selected to facilitate spin-coating and, if trenches therein are to be filled, a dielectric protective material of relatively low viscosity to facilitate application of the material and void-free trench filling.

Table 1 shows the results of experiments performed to assess the effect on yield of CSPs realized through the practice of the present invention. In each test, a Micron Technology, Inc. Y96A wafer-level package device with no protective layer or a protective layer according to the invention was inserted into a test socket and then removed to simulate testing in the ordinary course of production. In the tests shown in columns B, C, and D of Table 1, a fluxless protective material was formed on the test socket contact locations 201 of each CSP device at a width of about 1 mm along peripheral edges of the dice. Each CSP device was bumped with preformed solder balls. The protective material was then cured. The percentage of devices emerging from the test socket simulation without fatal defects, e.g., damage to integrated circuitry, was then calculated.

Table 1 is a compilation of results of a multi-socket test comparing yield of wafer-level package parts after test socket simulation without protective material and those having protective layers according to the invention. Column A shows the yields observed when no protective material was applied. Column B shows the yields observed with a protective layer of Ablestik RP658-5B formed to a thickness of about 15 μm. Column C shows the yields observed with a protective layer of Ablestik RP658-7A formed to a thickness of about 15 μm. Column D shows the yields observed with a protective layer of Ablestik RP658-7A formed to a thickness of about 30 μm.

Table 1 shows that after test socket simulation, yields of CSP devices with protective layers according to the invention were 16% to 18.8% higher after 25 cycles in electrical test sockets than yields of CSP devices bearing no protective layer, thus demonstrating the substantial improvements in CSP device robustness and attendant yield increase, realized through the practice of the present invention. These gains translate directly to improved efficiency and profitability of CSP device production.

TABLE 1

| TEST CYCLE | A<br>MATERIAL = NONE<br>THICKNESS = 0 | B<br>MATERIAL = RP658-5B<br>THICKNESS = 15 μm | C<br>MATERIAL = RP658-7A<br>THICKNESS = 15 μm | D<br>MATERIAL = RP658-7A<br>THICKNESS = 30 μm |
|---|---|---|---|---|
| 1 | 100.0% | 100.0% | 100.0% | 100.0% |
| 2 | 98.1% | 100.0% | 100.0% | 100.0% |
| 3 | 96.1% | 100.0% | 99.1% | 100.0% |
| 4 | 95.2% | 100.0% | 99.1% | 100.0% |
| 5 | 94.2% | 100.0% | 99.1% | 100.0% |
| 6 | 94.2% | 100.0% | 99.1% | 100.0% |
| 7 | 93.2% | 99.0% | 99.1% | 100.0% |
| 8 | 93.2% | 99.0% | 99.1% | 100.0% |
| 9 | 92.8% | 99.0% | 99.1% | 100.0% |
| 10 | 92.3% | 99.0% | 99.1% | 100.0% |
| 11 | 91.8% | 99.0% | 99.1% | 100.0% |
| 12 | 89.9% | 98.6% | 99.1% | 100.0% |
| 13 | 89.4% | 98.1% | 99.1% | 100.0% |
| 14 | 88.4% | 98.1% | 99.1% | 100.0% |
| 15 | 88.4% | 98.1% | 98.1% | 100.0% |
| 16 | 86.5% | 97.6% | 98.2% | 100.0% |
| 17 | 85.5% | 97.6% | 98.1% | 100.0% |

TABLE 1-continued

| TEST CYCLE | A<br>MATERIAL = NONE<br>THICKNESS = 0 | B<br>MATERIAL = RP658-5B<br>THICKNESS = 15 μm | C<br>MATERIAL = RP658-7A<br>THICKNESS = 15 μm | D<br>MATERIAL = RP658-7A<br>THICKNESS = 30 μm |
|---|---|---|---|---|
| 18 | 85.0% | 97.6% | 98.1% | 100.0% |
| 19 | 84.1% | 97.6% | 98.1% | 100.0% |
| 20 | 83.6% | 97.6% | 98.1% | 100.0% |
| 21 | 82.6% | 97.6% | 98.1% | 100.0% |
| 22 | 82.6% | 97.6% | 97.2% | 100.0% |
| 23 | 81.6% | 97.6% | 97.2% | 100.0% |
| 24 | 81.6% | 97.6% | 97.2% | 100.0% |
| 25 | 81.2% | 97.6% | 97.2% | 100.0% |

The left-hand side of FIG. 6D shows dielectric protective layer 20 formed over the entire active side 8, including over test socket contact locations 201 and in pre-scribed street area trench 9, while the right-hand side of FIG. 6D shows selective placement of dielectric protective layer 20 along the periphery of die location 401 and down into trench 9. Trench 9 in FIG. 6D corresponds in location and lies within a street area 7 in FIG. 4, and line 5 shows the location where semiconductor wafer 400 will be sawed for singulation at substantially the center of trench 9. Pre-scribed street area trench 9 is sufficiently wider than the wafer saw used for singulation that at least some thickness of dielectric protective layer 20 remains on the edges 11 of singulated semiconductor dice 101, as illustrated in FIG. 7. After singulation along line 5, dielectric protective layer 20 provides protection to both active surface 8 as well as edges 11 of the resulting semiconductor dice 101.

Figure 6B:
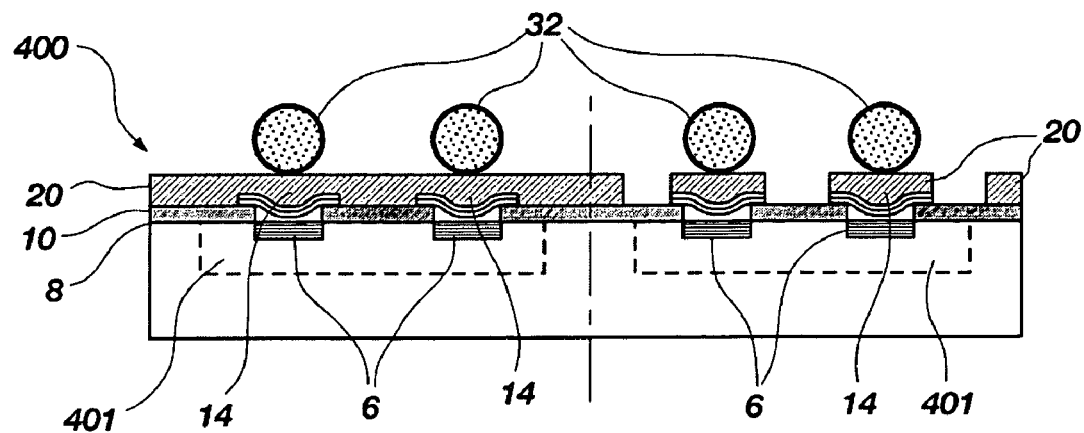
Figure 6C:
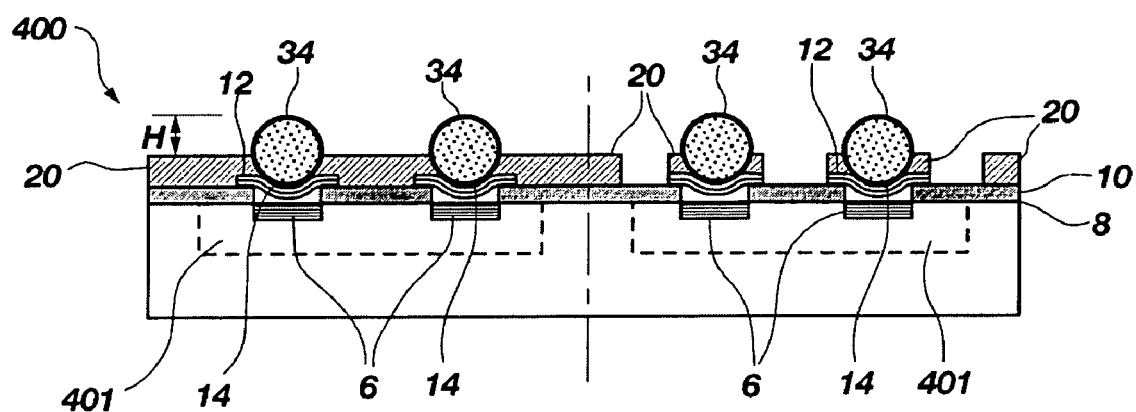
Figure 6D:
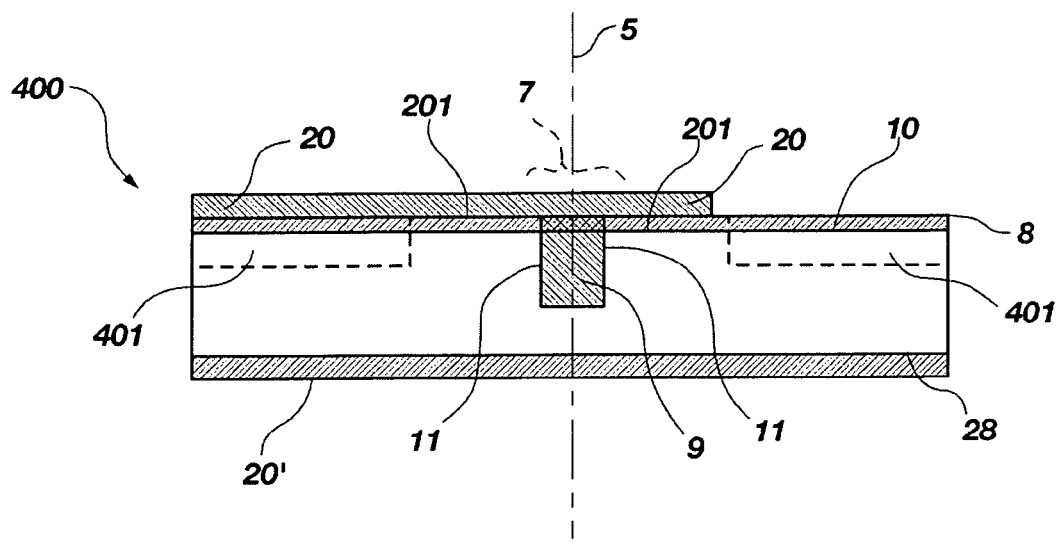
Figure 7:
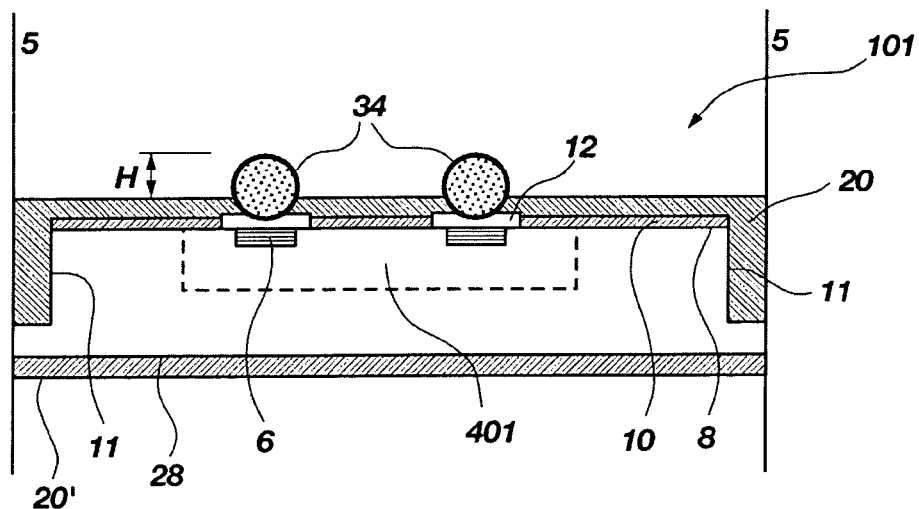
FIG. 7 shows a singulated CSP die of the present invention with a protective layer formed on the active surface and edges thereof.

In the exemplary embodiments depicted in FIGS. 6A, 6B, 6C and 6D, dielectric protective layer 20 may be formed (as shown on the left-hand side of the drawing figures) over the entire active side 8 of semiconductor wafer 400, including over intended test socket contact locations 201 and in pre-scribed street area trench 9 (see FIG. 6D) or selectively (as shown on the right-hand side of the drawing figures at locations on the active side 8 and, optionally, in pre-scribed street area trench 9. FIG. 6B shows a subsequent stage of fabrication of the semiconductor wafer depicted in FIG. 6A at which preformed solder balls 32 are disposed over external contact locations 14. Preformed solder balls 32 are positioned over UBMs 12 at external contact locations 14 by means known in the art. For example, a conventional jig (not shown) may be used to locate a matrix of preformed solder balls 32 over external contact locations 14; however, any method known in the art for placing preformed solder balls may be used.

Referring now to FIG. 6C, upon heating to a temperature characteristic of the melting point of the metal in preformed solder balls 32, preformed solder balls 32 are at least partially reflowed (melted), volatiles in the flux material in dielectric protective layer 20 are driven off, and the molten metal of preformed solder balls 32 wets to external contact locations 14 and, more specifically, to UBM 12 structures thereof. The heating process also at least partially cures dielectric protective layer 20 to at least a semisolid state.

After the heating process, conductive bumps 34 formed by reflow of preformed solder balls 32 extend a height H above dielectric protective layer 20. During reflow, the metal of each of the preformed solder balls 32 wets and bonds to the underlying UBM 12 at external contact locations 14 upon cooling and solidification, providing semiconductor die locations 401 with conductive bumps 34 that are suitable for attachment to higher-level circuit structures. Because dielectric protective layer 20 is already in place over the entirety of or on selected locations on active surface 8, including over test socket contact locations 201 and in pre-scribed street area trench 9, there is no need to add further CSP structure materials over conductive bumps 34 or to the sides of CSP semiconductor dice singulated from semiconductor wafer 400. Accordingly, no protective layer voids or other defects are introduced by the presence of conductive bumps 34, and additional processing to expose conductive bumps 34 through dielectric protective layer 20 is not required.

In some embodiments, dielectric protective layer 20 may be formed at a reduced thickness over contact locations 14 and UBM 12 relative to other areas, such as, for example, test contact locations 201 and pre-scribed street area trenches 9, to facilitate improved bonding of preformed solder balls 32 to UBM 12 at each external contact location 14 while maintaining the thickness of dielectric protective layer 20 over areas that are more susceptible to physical damage during testing and handling.

In contrast to known CSP production, in the present invention where the protective layer 20 is formed over contact locations 14 and UBM 12, no flux cleaning process is required after formation of conductive bumps 34 because any residual flux material is contained within the cured protective layer 20.

In all of the above-described embodiments, once dielectric protective layer 20 is at least partially cured and conductive bumps 34 have been formed on semiconductor wafer 400, semiconductor wafer 400 may be singulated along the aforementioned pre-scribed street area trenches 9 (i.e., along line 5 of FIG. 6D) to provide individual semiconductor dice 101, as shown in FIG. 8. When dielectric protective layer 20 is only partially cured during the above-described heating process, singulation may occur before or after subsequent heating processes to complete the cure of dielectric protective layer 20.

Dielectric protective layer 20 acts as a portion of the CSP structure to protect active surface 8 and edges 11 of a semiconductor die 101, as shown in FIG. 7. FIG. 7 also shows the position of line 5 of FIG. 6D in relation to a singulated die. An additional dielectric protective layer 20' of the same or a different material may be applied to back surface 28 of a semiconductor die 101 to form a more completely encapsulated CSP structure. Of course, one or more additional protective layers may be formed before singulation, such as by covering back side 28 of semiconductor wafer 400 immediately after the back grinding operation.

After curing, the thickness of dielectric protective layer 20 may be, for example, approximately 5 μm to approximately 40 μm. It is currently believed that a beneficial thickness of dielectric protective layer 20 may be in the range of approximately 1 μm to more than 40 μm and, more preferably, in the range of approximately 10 μm to approximately 30 μm, although it is to be understood that protective layer 20 may be of any thickness appropriate for a given application, as may be determined by those of ordinary skill in the art. Of course, the thickness of the dielectric protective material along edges of semiconductor dice 101 may be easily adjusted through selection of an appropriate trench width. Similarly, the length, width and surface area of dielectric protective material may be selected and altered, as desired, to provide sufficient surface area to prevent damage to the semiconductor die from contact with a test socket or other structures during testing and handling. As little as a 0.1 mm width of dielectric protective material may suffice, particularly if it is accurately placed and extends over a substantial length. However, surface area of protective coverage may be, desirably, generally maximized as long as the material, after placement and cure, does not induce excessive stress on, or warpage of, the wafer or die. Thus, if blanket coverage of a device surface is not desired, coverage along a periphery of the active surface and corners thereof (rectangles, triangles bounded on two sides by the die edge, etc.), or intermittently on the active surface and strategic locations (island coverage) may all comprise effective protection approaches, depending on the situation.

Figure 8A:
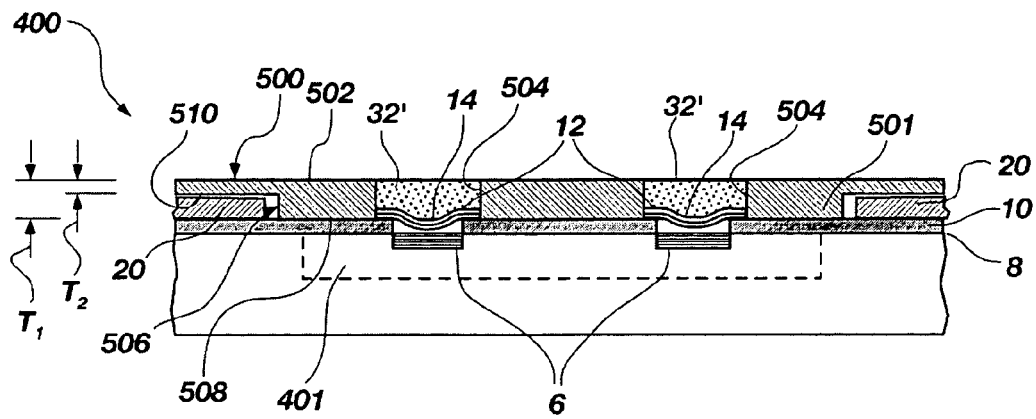
FIGS. 8A and 8B illustrate another embodiment of the method of the present invention for formation of a CSP protective layer as well as conductive bumps on a wafer.
Figure 8B:
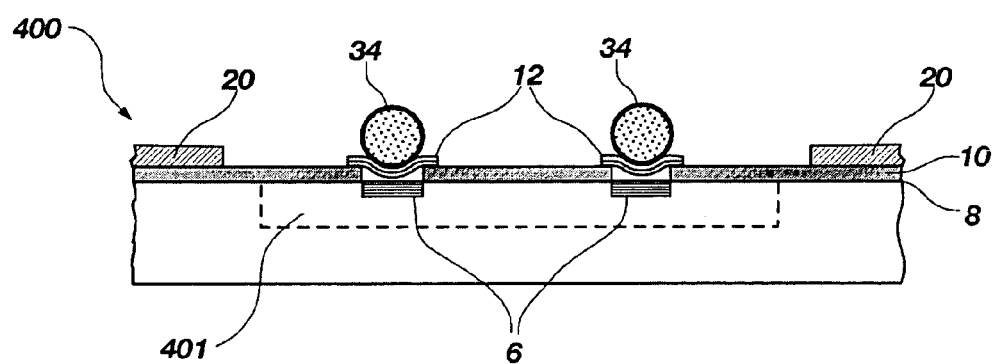

FIGS. 8A and 8B illustrate, in simple schematic form, another embodiment of the present invention wherein a protective layer 20 is formed over portions of active side 8 of a wafer 400 and conductive bumps 34 are then formed on bond pads 6, which may carry UBMs 12, as shown. Bond pads 6 may comprise original bond pad locations or redistributed bond pad locations, as previously mentioned. Protective dielectric material may be disposed over active side 8 of wafer 400 to form protective layer 20 and may, but does not necessarily have to be, cured at that time. A stencil 500 is then placed over active side 8 of wafer 400 and in contact therewith. Like conventional stencils, stencil 500 includes a body 501 exhibiting a substantially planar, or single-level, upper surface 502 and apertures 504 therethrough from upper surface 502 into which a solder paste 32' may be disposed. However, unlike conventional stencils, stencil 500 exhibits a multi-level lower surface 506, lower surface 506 comprising first stencil portions 508 of a relatively greater thickness $T_1$ for resting on or closely adjacent UBM 12 structures 12 with apertures 504 exposing UBM 12 therethrough and second stencil portions 510 of a relatively lesser thickness $T_2$ which clear, or remains out of contact, with underlying portions of protective layer 20 to preclude any damage thereto when stencil 500 is in contact with active side 8 of wafer 400. After solder paste 32' is stenciled onto UBM 12, stencil 500 is removed. Subsequently, a reflow operation is then conducted, melting the solder in solder paste 32' and driving off volatiles, to form conductive bumps 34, as shown in FIG. 8B. If the dielectric protective layer 20 has not been previously cured, the heat used in the reflow operation is also employed to cure the dielectric material.

As one of ordinary skill in the art will appreciate from reading this disclosure, further steps can be carried out to create a CSP memory die or other CSP integrated circuit device having a CSP protective layer formed according to the present invention.

The present invention improves the efficiency of CSP manufacture. Conventional CSP protective layer formation methods involve: (1) applying flux onto bond pads, (2) loading solder balls, (3) reflowing the solder balls, (4) flux cleaning, (5) applying a protective coating, (6) curing the protective coating, and (7) cleaning the solder balls of protective coating material or otherwise exposing the solder balls therethrough. In contrast, exemplary embodiments of the present invention involve only: (1) applying a layer of dielectric protective material over selected areas of the active side of the wafer and, optionally, in pre-scribed street trench areas, if any, (2) loading solder balls, (3) concurrently reflowing the solder balls and at least partially curing the protective layer, and (4) optionally completing the cure of the protective layer.

In some exemplary embodiments, the protective layer is applied only over potential test socket or other physical contact locations of the semiconductor dice, in wafer street trench areas, or both, in which case the fluxing capability may be omitted from the dielectric protective layer material and a filler material may be optionally included in the protective layer material to increase the hardness of the protective material and thereby further improve the robustness of the resultant CSP. In such embodiments, the filler material may be, for example, silica of varying particle sizes. Selection of a filler material appropriate for any given protective layer material is well within the ordinary skill in the art.

Figure 9:
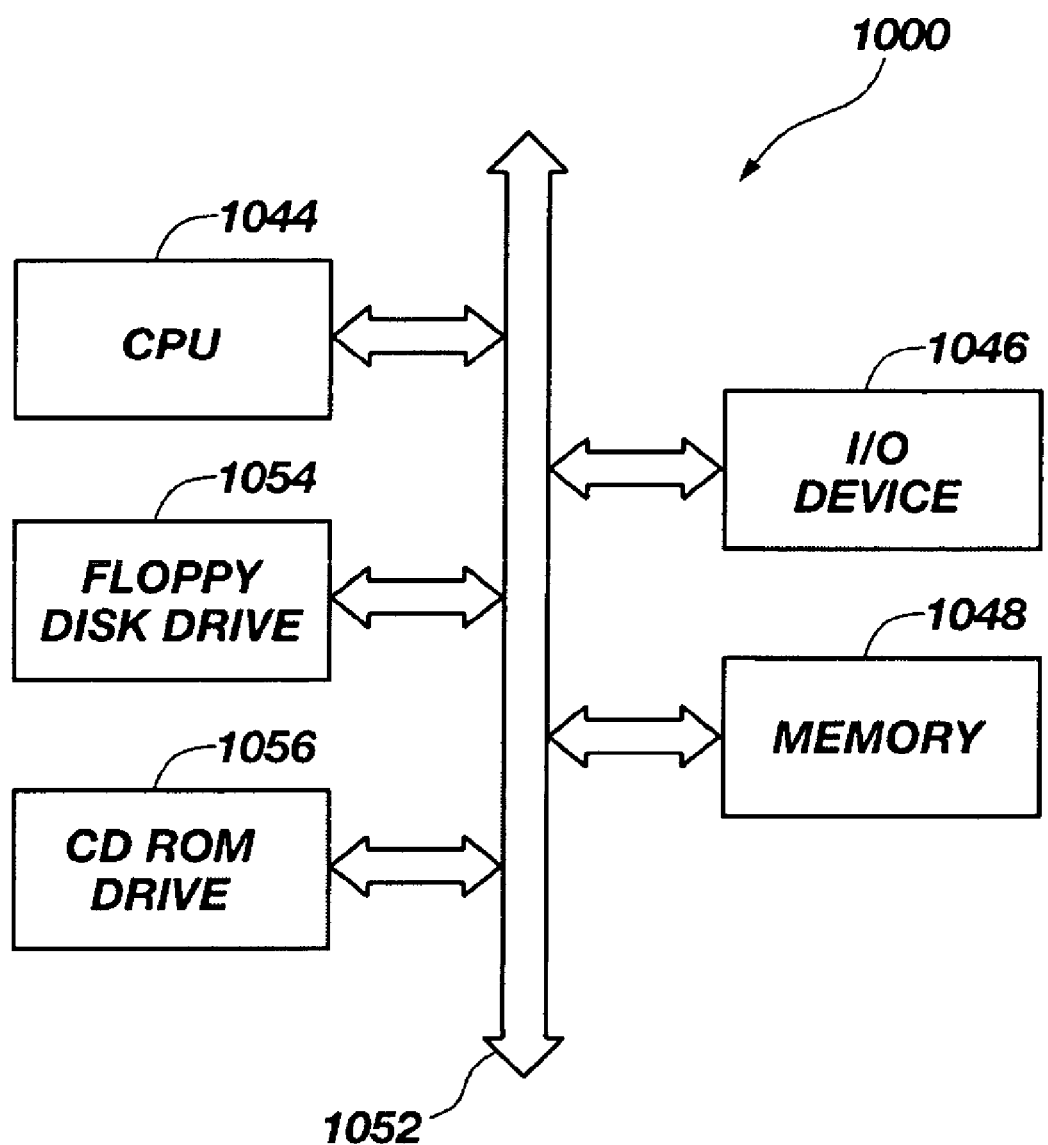
FIG. 9 illustrates an electronic system having a memory device or other electronic device including a protective layer of the invention.

FIG. 9 illustrates an embodiment of an electronic system 1000 having such a CSP die with a dielectric protective layer formed according to the present invention. As shown in FIG. 10, the electronic system 1000 is a processor-based system which includes a memory circuit 1048, for example, a DRAM, and a central processing unit (CPU) 1044. According to the invention, either the CPU 1044 or the memory circuit 1048, or both, contain dielectric protective layers formed according to the invention, such as the dielectric protective layers formed by the methods described in connection with FIGS. 6A-6D. The electronic system 1000 shown in FIG. 9 illustrates generally a computer system 1000. Such a computer system 1000 generally comprises a central processing unit (CPU) 1044, such as a microprocessor, a digital signal processor, or other programmable digital logic device, which communicates with an input/output (I/O) device 1046 over a bus 1052. The memory circuit 1048 communicates with the computer system 1000 over bus 1052.

In the case of a computer system 1000, the processor-based system may include peripheral devices such as a floppy disk drive 1054 and a CD-ROM drive 1056, which also communicates with CPU 1044 over the bus 1052. Of the teachings of the present invention, memory circuit 1048 can be constructed as a CSP integrated circuit device, including at least one dielectric protective layer formed according to the invention. In one exemplary embodiment, the memory circuit 1048 and the processor, for example, CPU 1044, can be formed in a single CSP as a single, integrated circuit such as a so-called "system on a chip."

Although the present invention has been described with respect to the illustrated embodiments, various additions, deletions and modifications are contemplated as being within its scope. For instance, while the disclosed embodiments show the external contact locations as UBM structures of a semiconductor wafer, the UBM structure may be omitted and the bond pads themselves comprise the external contact locations. This approach would be effective a cost-efficient when, for example, wettability of bond pads to the conductive bump material is not an issue, such as where conductive or conductor-filled epoxy bumps are employed or when the material of the bond pads is wettable by a metal bump material. Thus, for example, metal conductive bumps may be formed on bond pads by plating. Similarly, while described in terms of forming protective layers of a CSP, any type of electronic device substrate that requires external protection would benefit from the teachings of the present invention. The scope of the invention is, therefore, indicated by the appended claims, rather than the foregoing description. All changes which come within the meaning and range of equivalency of the claims are to be embraced within their scope.

What is claimed is:

1. An electronic system, comprising:
   at least one electronic device comprising a microprocessor; and
   at least another electronic device comprising a memory operably coupled to the microprocessor:
   at least one of the electronic devices comprising an active surface bearing an at least partially cured dielectric protective material at least partially disposed over and terminating adjacent at least one location thereon configured for contact with an external structure during at least one of handling, processing and testing thereof.

2. The electronic system of claim 1, wherein the at least one location is a peripheral location.

3. The electronic system of claim 2, where in the peripheral location extends along an entire periphery of the at least one electronic device.

4. An electronic device having an active surface, comprising:
   at least one location on the electronic device configured for contact with a test socket during at least one of handling, processing and testing of the electronic device;
   an at least partially cured dielectric protective material at least partially disposed over the at least one location; and
   at least one solder ball at least partially extending through the at least partially cured dielectric protective material and disposed adjoining an external contact location on the active surface.

5. The electronic device of claim 4, wherein the external contact location further comprises at least one underbump metallurgy structure.

6. The electronic device of claim 4, wherein the at least one location is a peripheral location.

7. The electronic device of claim 6, wherein the peripheral location extends along an entire periphery of the electronic device.

8. The electronic device of claim 4, wherein the at least partially cured dielectric protective material further comprises at least a flux material.

9. A substrate bearing, a plurality of electronic device locations on an active surface thereof, comprising an at least partially cured dielectric protective material comprising a flux material disposed over and terminating adjacent at least one peripheral location on each electronic device location configured for contact with an external structure during at least one of handling, processing and testing of a discrete electronic device formed therefrom.

10. The substrate of claim 9, wherein the at least one peripheral location extends along an entire periphery of each electronic device location of the plurality.

11. The substrate of claim 9, wherein the at least one peripheral location is at least one pre-scribed trench.

12. An electronic device having an active surface, comprising an at least partially cured dielectric protective material comprising at least a flux material at least partially disposed over at least one location thereon configured for contact with a connection terminal of a test socket.

13. The electronic device of claim 12, wherein the at least one location is a peripheral location.

14. The electronic device of claim 13, wherein the peripheral location extends alone an entire periphery of the electronic device.

15. An electronic system, comprising:
   at least one electronic device comprising a microprocessor; and
   at least another electronic device comprising a memory operably coupled to the microprocessor;
   at least one of the electronic devices comprising an active surface bearing an at least partially cured dielectric protective material comprising at least a flux material at least partially disposed over at least one location thereon configured for contact with a connection terminal of a test socket.

16. The electronic system of claim 15, wherein the at least one location is a peripheral location.

17. The electronic system of claim 16, wherein the peripheral location extends along an entire periphery of the at least one electronic device.

* * * * *

UNITED STATES PATENT AND TRADEMARK OFFICE
CERTIFICATE OF CORRECTION

PATENT NO. : 7,417,305 B2
APPLICATION NO. : 10/928666
DATED : August 26, 2008
INVENTOR(S) : Jiang et al.

It is certified that error appears in the above-identified patent and that said Letters Patent is hereby corrected as shown below:

In column 13, line 6, in Claim 1, delete "microprocessor:" and insert -- microprocessor; --, therefor.

In column 14, line 1, in Claim 9, after "bearing" delete ",".

In column 14, line 22, in Claim 14, delete "alone" and insert -- along --, therefor.

Signed and Sealed this

Twenty-eighth Day of October, 2008

JON W. DUDAS
*Director of the United States Patent and Trademark Office*